United States Patent [19]
Le et al.

[11] Patent Number: 5,949,123
[45] Date of Patent: Sep. 7, 1999

[54] SOLAR CELL INCLUDING MULTI-CRYSTALLINE SILICON AND A METHOD OF TEXTURIZING THE SURFACE OF P-TYPE MULTI-CRYSTALLINE SILICON

[75] Inventors: Quang Nam Le; Dominique Sarti, both of Bourgoin-Jallieu; Claude Levy-Clement, Meudon; Stéphane Bastide, Bourgoin-Jallieu, all of France

[73] Assignee: Photowatt International S.A., Bourgoin-Jallieu, France

[21] Appl. No.: 08/744,148

[22] Filed: Nov. 12, 1996

[30] Foreign Application Priority Data

Nov. 13, 1995 [FR] France .................................. 95 13415

[51] Int. Cl.⁶ .................................................. H01L 23/58
[52] U.S. Cl. ........................ 257/496; 438/745; 438/749; 136/258; 136/261
[58] Field of Search ............................ 257/496; 438/745, 438/749; 136/258, 261

[56] References Cited

U.S. PATENT DOCUMENTS 5,679,212  10/1997  Kato et al. .............................. 438/692

FOREIGN PATENT DOCUMENTS 3324232  1/1985  Germany .

OTHER PUBLICATIONS

P. Menna et al, "Porous Silicon in Solar Cells: a review and a description of its application as an AR coating", *Solar Energy Material and Solar Cells*, vol. 37, No. 1 Apr. 1995, Amsterdam NL, pp. 13–24.

E. Vazsonyi et al, "High efficiency silicon pv cells with surface treatment by anodic etching", *13th European Photovoltaic Solar Energy Conference*, Oct. 23–27, 1995, pp. 37–40.

Patent Abstracts of Japan, vol. 15, No. 258 (E–1084) Jun. 28, 1991 corresponding to JP–A–03 083339 (Sumitomo Electric Ind. Ltd.) Apr. 9, 1991.

Y. S. Tsuo et al, "Potential application of porous silicon in photovoltaics", *23rd IEEE Phtovoltaic Specialists Conference*, May 10–14,1993, Louisville, USA, pp. 287–293.

S. Bastide et al, "The effect of porous silicon on the emitter of a photovoltaic cell", *12th European Photovoltaic Solar Energy Conference*, Apr. 11–15, 1994, Amsterdam, NL, pp. 780–783.

Primary Examiner—Mark Chapman
Attorney, Agent, or Firm—Sughrue, Mion, Zinn, Macpeak & Seas, PLLC

[57] ABSTRACT

A solar cell comprising multi-crystalline silicon or an alloy thereof, having a surface that is to receive light radiation, wherein said silicon surface includes a multi-tude of pits of depth lying in the range 0.10 μm to 10 μm and of diameter lying in the range 0.1 μm to 10 μm, and in which the ratio of said depth to said diameter is greater than 1, the area of said holes occupying more than half the area of said silicon surface.

10 Claims, 4 Drawing Sheets

SOLAR CELL INCLUDING MULTI-CRYSTALLINE SILICON AND A METHOD OF TEXTURIZING THE SURFACE OF P-TYPE MULTI-CRYSTALLINE SILICON

Crystalline silicon has numerous applications in the following fields: photo-electricity; photo-voltaic; optical; thermal; micro-electronic; and in the semi-conductor industry. The present invention relates to a solar cell or photo-cell whose surface receiving light radiation is constituted by multi-crystalline silicon. The invention relates more particularly to a solar cell including silicon whose surface has been modified by texturization treatment in order to increase its optical performance.

BACKGROUND OF THE INVENTION

Texturization consists in creating roughness at the surface of the material in order to enable multiple reflection of light incident on its surface, thereby leading to greater absorption of the light inside the material. The roughness obtained in this way has two complementary effects: the first effect is to reduce the reflecting power or optical reflectivity of the surface; and the second effect is to increase the length of the optical path travelled by the incident light inside the material. In a photo-cell, the increase of light absorption in the silicon gives rise to an increase in the effectiveness with which light is transformed into electricity.

Several methods make it possible to achieve this result and lead to uniform texturization of the surface revealing well-defined crystallographic planes thereat. Mention may be made of methods such as mechanical engraving, laser etching, photo-lithography, masking, etc., however they are complex and expensive to implement. The method of surface texturization that is presently known and used on an industrial scale consists in using at high temperature an alkaline aqueous solution based on sodium hydroxide (NaOH) or on potassium hydroxide (KOH). Those solutions have the property of etching silicon aniosotropically depending on the crystallographic orientation of the grains situated at the surface, thereby modifying the surface morphology of the silicon. Etching speed is about 100 times greater on planes having crystallographic orientation [100] than on [111] planes. This causes the surface to be texturized in the form of regular pyramids situated on [100] planes that trap incident light and this is referred to by the term "macro-texturization". For multi-crystalline silicon, it is estimated that only 20% of the surface is constituted by grains having this crystallographic orientation, which means that the treatment is less effective with respect to optical reflectivity. The method is therefore fully effective only in the special case of monocrystalline silicon having crystallographic orientation [100] at its surface to be treated.

To reduce the optical reflectivity of an n-type monocrystalline silicon surface to a greater extent, work relating to photo-electrochemical etching in an acid medium has been performed by A. Lagoubi et al. (11th Photo-voltaic Solar Energy Conference, Montreux, 1992). The superposition of a nanoporous outer layer (a layer having pores of diameter less than 50 nm) and of a macro-porous inner layer (pores of diameter greater than 50 nm) is revealed by dissolving the nanoporous layer. The surface coated in the macro-porous layer has lower reflectivity than does the untreated surface.

That work suffers from the drawback of relating solely to n-type monocrystalline silicon. Also, it is not easy to perform a photo-electrochemical method in an industrial medium.

Users therefore need to have available a method that is industrially applicable for achieving uniform texturization of the surface of multi-crystalline silicon regardless of the crystallographic orientation of the grains at its surface.

OBJECTS AND SUMMARY OF THE INVENTION

An object of the invention is to propose a solar cell including multi-crystalline silicon whose efficiency is improved compared with presently known and used solar cells.

Another object of the present invention is to propose a method of texturizing the surface of p-type multi-crystalline silicon which is effective and cheap and which makes it possible to reduce its optical reflectivity significantly and to increase its effective absorption.

The present invention provides a solar cell comprising multi-crystalline silicon or an alloy thereof, having a surface that is to receive light radiation, wherein said silicon surface includes a multi-tude of pits of depth lying in the range 0.10 $\mu$m to 10 $\mu$m and of diameter lying in the range 0.1 $\mu$m to 10 $\mu$m, and in which the ratio of said depth to said diameter is greater than 1, the area of said holes occupying more than half the area of said silicon surface.

Solar cells of the invention are made from multi-crystalline silicon, also referred to as poly-crystalline silicon, having p-type conductivity, or from an alloy thereof, in particular with germanium. The silicon may be in bulk form, e.g. in the form of thin plates having a thickness of a few hundreds of micro-ns, or it may be in the form of a tape or a thin layer having a thickness of about 50 $\mu$m.

The silicon of cells of the invention have a surface cratered with cavities of regular shape, referred to by the term "pits" distributed in uniform manner and situated independently of the crystallographic orientation of the surface grains. The ratio of hole depth to hole diameter is one of the main parameters determining the efficiency with which incident light is trapped within the material. To absorb light, efficiency improves with increasing hole depth providing it is less than 15 $\mu$m, and with a depth/diameter ratio that is as large as possible, and greater than 1.

The present invention also provides a method of texturizing a surface of p-type multi-crystalline silicon and alloys thereof, the method consisting essentially in combining the following two steps:

a first step constituted by partial chemical oxidation of said surface by an oxidizing solution also containing fluorine ions, for the purpose of making said silicon surface porous to form a layer; and a second step which consists in dissolving said layer to obtain said texturized surface.

The surface to be treated is particularly, but not exclusively, obtained by sawing. The raw sawn surface is clean and free from impurities that could inhibit chemical oxidation. It does not need to be cleaned chemically in order to obtain a surface having chemical polish. In other circumstances, chemical polishing by means of a commercial solution may be envisaged.

The porous silicon is obtained during the first step by chemical oxidation at localized positions on the surface of the p-type multi-crystalline silicon. This operation consists in oxidizing a portion of the silicon by forming a fluorinated complex which dissolves, leaving a surface layer containing gaps called pores. Isotropic oxidation of the silicon is obtained exclusively in the presence of fluorine ions. The rate of corrosion is controlled in part by the concentration of fluorine ions for concentrations lying in the range 0.01 M to 25 M. Under such conditions, corrosion of the silicon is not uniform but is localized, thereby giving rise to deformation of porous silicon.

In a first implementation of the invention, said oxidizing solution is an acid aqueous solution also containing fluorine ions. The pH of the solution is preferably less than 5.

In a second implementation of the invention, said oxidizing solution is an organic solution also containing fluorine ions, for example the organic medium may be constituted by acetonitrile $CN-CH_3$.

Oxidation is preferably performed by a solution containing an oxidizing agent selected from the chromate ion $CrO_3^-$ coming from chromic acid $HCrO_3$, for example, the bromate ion $BrO_3^-$ supplied for example by potassium bromate $KBrO_3$, the nitrate ion $NO_3^-$ coming for example from nitric acid $NHO_3$, the nitrite ion $NO_2^-$ supplied for example by sodium nitrite $NaNO_2$, the amine ion coming for example from ethylenediamine, a metallic redox couple such as the following couples for example $Cu^{2+}/Cu^+$, $Fe^{2+}/Fe^{3+}$, $I_3^-/I^-$, $Mn^{7+}/Mn^{2+}$, or $S^{7+}/S^{6+}$, and mixtures thereof. In order to avoid excessive disturbance of the surface, it is preferable to use low concentrations of oxidizing agent.

For better control over the reaction, it is possible to add an inhibitor agent to the oxidizing solution for the purpose of slowing down the rate of silicon corrosion, e.g. acetic acid $CH_3COOH$, or any other compound compatible with the reaction conditions and possessing a dielectric constant of the same order of magnitude as acetic acid.

At the end of the second step, controlled dissolution of the porous silicon reveals a surface cratered with pits. This aspect is referred to below by the term "micro-texturization".

Said second step consists in dissolving the porous silicon in a solution selected from an alkaline aqueous solution, an organic solution of ethylene glycol, and an organic solution of hydrazine. With an alkaline aqueous solution, said alkali is preferably selected from sodium hydroxide NaOH, potassium hydroxide KOH, ammonium hydroxide $NH_4OH$, and mixtures thereof.

The purpose of th is dissolution step is to remote the surface porous layer in order to reveal the interface between said layer and the core of the material. The idea is thus to dissolve in controlled manner the porous layer that was formed during the first step. The rate of dissolution is associated with the concentration of the dissolving solution and it is advantageous for it to be low. It is important to control the way in which the reaction progresses so as to avoid disturbing the morphology of the new surface as revealed by dissolving the porous silicon.

In a preferred implementation, said second step is performed in an alkaline aqueous solution whose alkali concentration lies in the range 0.001 M to 2 M, at a temperature lying in the range 0° C. to 30° C. Rapid contact lying in the range 1 second to 5 minutes is generally sufficient.

Dissolution may be prolonged until the surface presents hardly any micro-texturization. Reflectivity measurements show that the surface becomes less and less reflective as dissolving time increases and reaches a minimum value of reflectivity which corresponds to a micro-texturized surface of the invention. Thereafter reflectivity increases as the surface becomes smoother.

In a variant, said method also comprises, before said first step, a prior step of limited chemical etching of said surface by means of an alkaline aqueous solution at a temperature greater than 30° C. This step consists in dissolving a portion of the silicon of the surface. This treatment analogous to the prior art method leads to macro-texturization of the surface of the silicon in the form of structures defined by the [111] crystallographic planes which are pyramids for a surface having [100] orientation. The first step, and then the second step, of the method of the invention are then performed. Dissolving the porous silicon layer causes micro-texturization to appear that is added to the micro-texturization obtained during the prior step to increase the efficiency thereof.

In another variant, said method further comprises, after said second step, a third step consisting in depositing an antireflective layer on said texturized surface. The performance obtained with surfaces that have been texturized by the method of the invention makes it possible in some cases to avoid using an antireflection layer, thereby achieving a corresponding reduction in manufacturing cost.

The advantage of the method of the invention is to increase the diffusion of light radiation within the silicon starting from the micro-texturized surface. Optical confinement is improved, thereby making it possible to use a material of poorer electronic quality and thus of lower cost. The regular topology of the texturized surface makes it possible to achieve fine deposits, e.g. by silkscreen printing, in particular for collecting electrical current. Thus, a solar cell of the present invention provides improved photovoltaic conversion efficiency for reduced cost.

BRIEF DESCRIPTION OF THE DRAWINGS

The invention will be better understood and other advantages and features will appear on reading the following examples of embodiments given by way of non-limiting illustration and with reference to the accompanying drawings, in which.

MORE DETAILED DESCRIPTION

EXAMPLE 1

The surface of a sample A of p-type multi-crystalline silicon was texturized by the method of the invention. Part of the surface of sample A was put into contact with an aqueous solution containing nitric acid $HNO_3$ and hydrofluoric acid HF in a ratio of 1 to 3. The treatment lasted for about 5 minutes at ambient temperature. The silicon of the treated surface was thus made porous. The porous layer was subsequently dissolved by rapid contact with an alkaline solution of sodium hydroxide NaOH at a concentration of about 0.12 M.

A micro-texturized surface was then obtained having pits with a diameter and a depth of about 10 µm.

EXAMPLE 2

The surface of a sample B of p-type multi-crystalline silicon was texturized by the method of the invention. The surface was put into contact with an aqueous solution containing hydrofluoric acid HF and sodium nitrite $NaNO_2$ in a ratio of 1 to 400. The porous silicon layer that formed was uniform over its entire area and its thickness was about 0.6 µm. The porous layer was then dissolved as described in Example 1.

Figure 1:
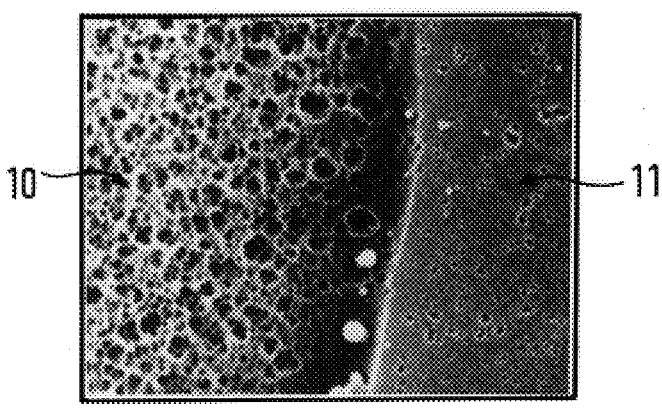
FIG. 1 is a photo-graph made by a scanning electron micro-scope (0.5 cm=1 $\mu$m) showing the surface of silicon that has been partially micro-texturized by the method of the present invention.

FIG. 1 shows the treated zone 10 of the surface of silicon sample A. The micro-texturized surface comprises pits of size lying in the range 0.1 µm to 0.3 µm, which is much greater than the size of the pores in the porous silicon formed during the first step. Contiguous zone 11 was not subjected to treatment.

EXAMPLE 3

Two samples C and D of p-type multi-crystalline silicon were subjected to surface texturization.

Figure 2:
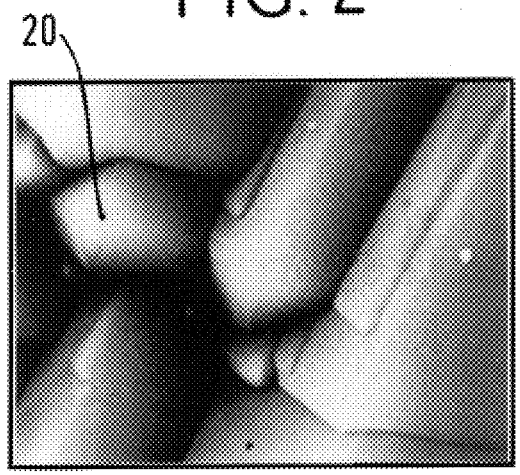
FIG. 2 is analogous to FIG. 1 and shows the surface of silicon that has been macro-texturized by the prior art method.

The surfaces of the samples were put into contact with an alkaline solution of sodium hydroxide NaOH, at a concentration of 0.5 M and at a temperature of 80° C. FIG. 2 shows the pyramids 20 that appeared at the surface of the samples at the end of the macro-texturization treatment of the prior art.

Thereafter, the surface of sample D was put into contact with an aqueous solution containing hydrofluoric acid HF and sodium nitrite $NaNO_2$ as described in Example 2. The porous layer was then dissolved by an alkaline solution as described in Example 1.

Figure 3:
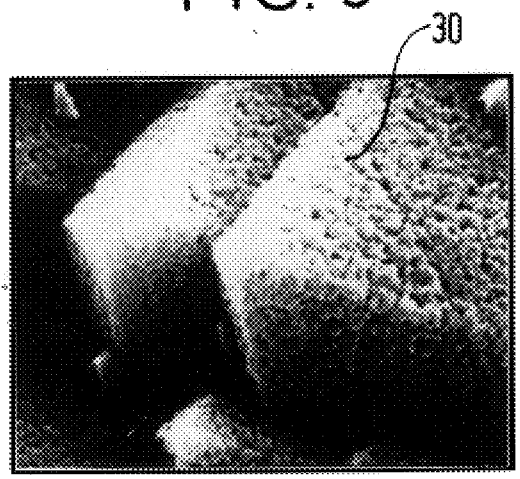
FIG. 3 is analogous to FIG. 1 and shows the surface of silicon texturized by the method of the invention when it includes a prior chemical etching step.

FIG. 3 shows the surface of sample D after micro-texturization treatment of the invention. It can be seen therein that the shape of the pyramids 30 is slightly modified with the edges thereof being less sharp, particularly at the base of the pyramids, and it can be seen that the surface thereof is cottony in appearance. Micro-texturization is present over the entire surface, and pore diameter is of the order of 0.1 µm to 0.2 µm. This micro-texturization is analogous to that observed on sample B of Example 2.

Total reflection measurements were performed on previously prepared samples C and D. The results obtained are given in FIG. 4. They show that the texturization performed on sample D using the method of the invention (curve 40) leads to better absorption of light in the visible range than does macro-texturization on its own as performed on sample C using the prior art method (curve 41).

EXAMPLE 4

Samples E and F were prepared respectively analogous to samples C and D of Example 3, with the exception that they were then coated in an antireflection layer.

Figure 4:
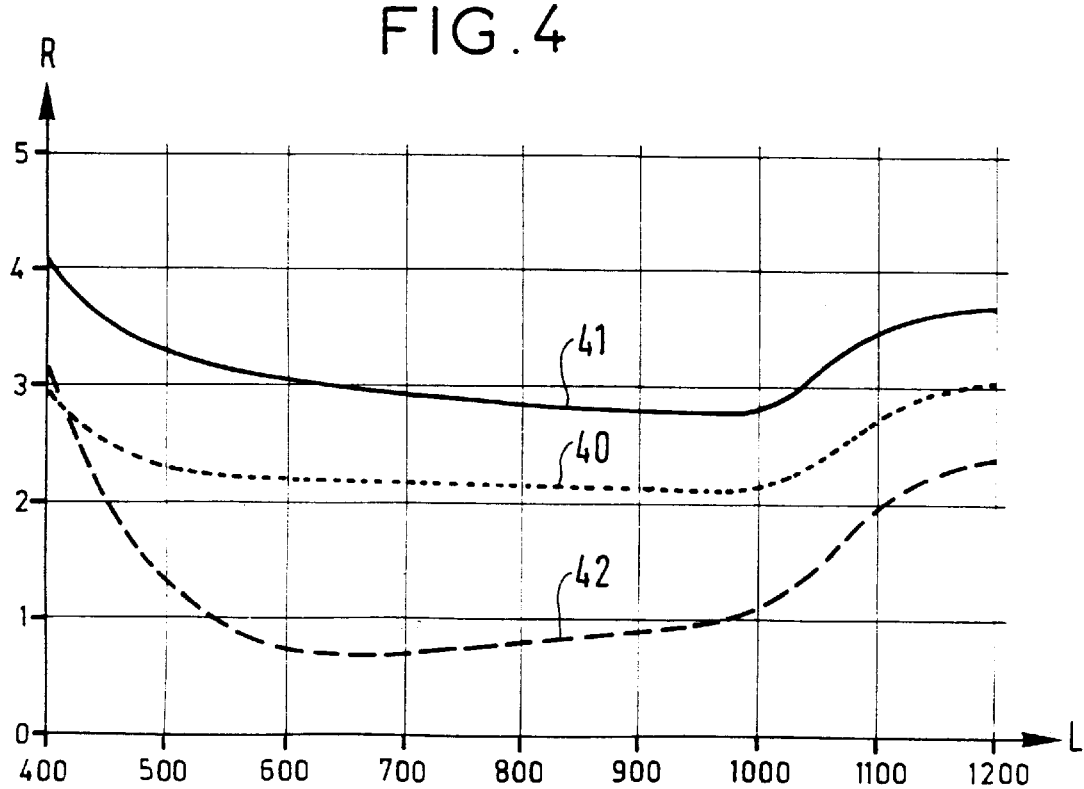
FIG. 4 shows the reflectivity of incident light radiation on the surface of silicon as a function of its wavelength and depending on whether the surface has been texturized by the prior art method or by the method of the present invention, reflectivity R being plotted up the ordinate in tens of % (i.e. ×10%) and the wavelength L of the incident wave being plotted along the ordinate in nm.

Total reflection measurements were performed on sample F in the same manner as in Example 3. FIG. 4 shows that depositing an antireflection layer on sample F whose texturization had been performed using the method of the present invention led to better absorption of light in the visible range (curve 42) than did the micro-texturizing on its own as performed on sample D by the method of the invention (curve 40).

EXAMPLE 5

Solar cells were prepared from samples G, H, and J as follows. The samples were in the form of thin plates of p-type multi-crystalline silicon having two faces of large area. Each face was texturized. Sample G was treated by the prior art method under conditions analogous to those used for sample C in Example 3. The samples H and J were prepared by the method of the invention in a manner analogous to sample D in Example 3. An n-p junction was made on one face of the plates by doping in conventional manner. Sample J then had that face coated in an antireflection layer. Thereafter, conventional means were applied to the samples for collecting electricity produced under the effect of light radiation.

Figure 5:
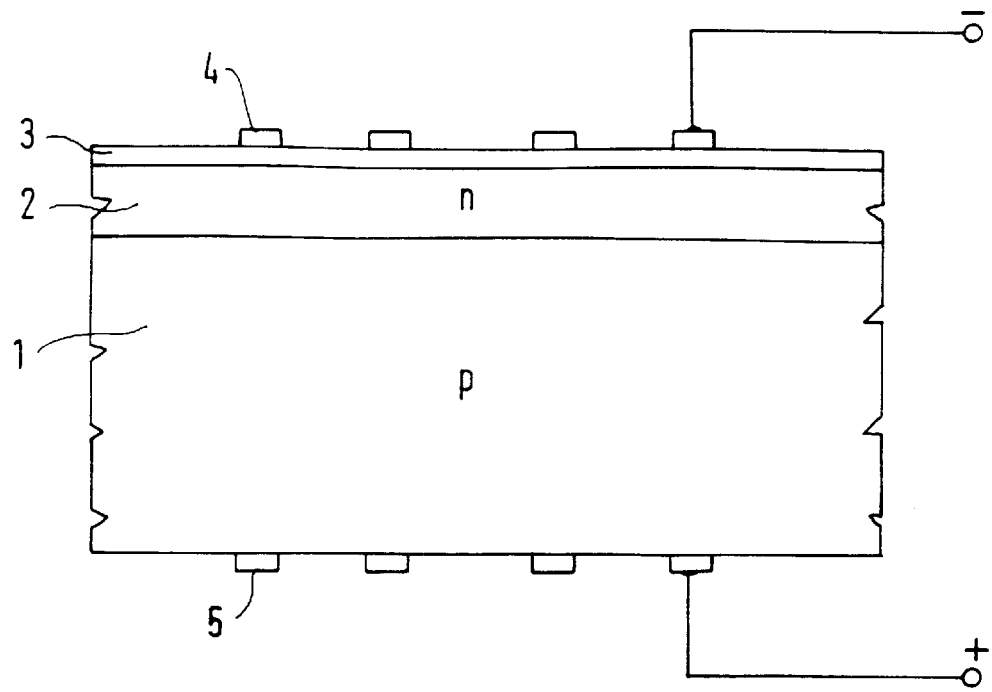
FIG. 5 is a diagrammatic section through a solar cell of the invention.

A solar cell of the invention including p-type multi-crystalline silicon prepared in a manner analogous to sample J is shown in diagrammatic section in FIG. 5. It is in the form of a square plate of side 10 cm and of thickness 200 µm. After texturizing one of the faces of the p-type multi-crystalline silicon plate, impurities (atoms of phosphorus, arsenic, etc.) were diffused into its surface to dope the p-type multi-crystalline silicon into n-type without altering its surface appearance. The plate then comprised a core 1 of p-type multi-crystalline silicon having a texturized face covered on its surface in a thin layer 2 of n-type multi-crystalline silicon. The thickness of the layer 2 was about 0.1 µm to 1 µm. This produced an n-p junction. This surface for receiving the light radiation was coated in an antireflection layer 3, e.g. of $TiO_2$. A current collector grid 4 based on silver powder to constitute the negative terminal of the cell was deposited by silkscreen printing. Similarly the opposite face was coated in a current collecting grid 5 constituting the positive terminal of the cell.

The performance of the various solar cells was evaluated by the following methods and the results obtained are summarized in Table I below.

The current/voltage characteristic of the cell was determined by imposing a voltage varying from 0 mV to 600 mV under incident energy of 1 kW/m² as specified in standard CEI 904-3 (or IEC 904-3) which gives a reference for the spectral distribution of sunlight.

Figure 6:
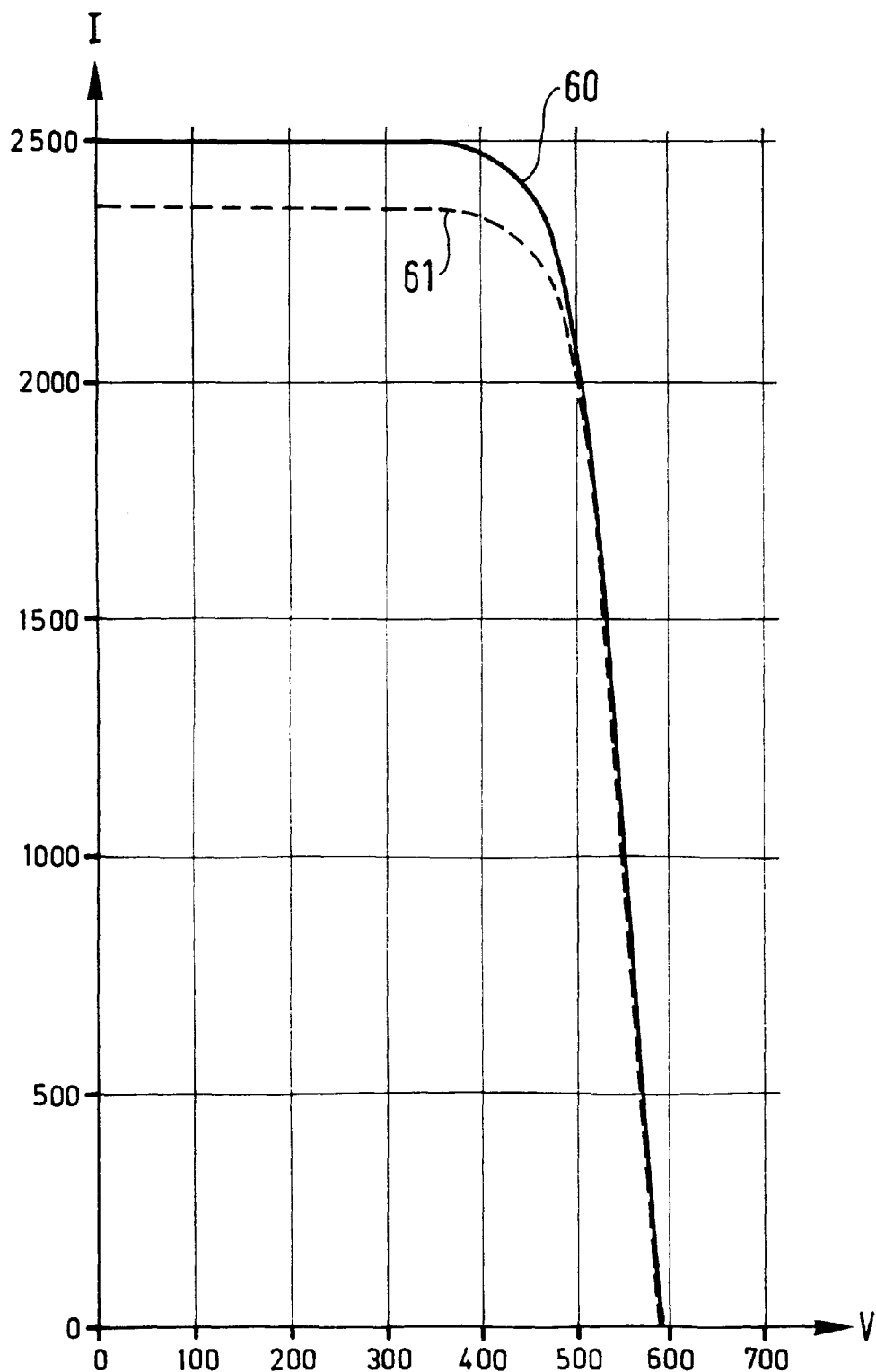
FIG. 6 shows how current varies as a function of voltage for a solar cell depending on whether the solar cell comprises silicon whose surface has been texturized by the prior art method or by the method of the present invention, current I being plotted up the ordinate in mA and voltage V being plotted along the abscissa in mV.

This characteristic is given in FIG. 6 by curve 60 for sample H of the invention and by curve 61 or sample G of the prior art. It is thus possible to deduce the maximum values of current $I_{max}$ and of voltage $V_{max}$ that the cell can supply.

The short circuit current $I_{cc}$ was measured at ambient temperature (25° C.) at zero voltage V=0.

Photo-voltaic conversion efficiency R was calculated as the ratio of restored electrical energy over incident light energy.

TABLE I

| sample | $I_{cc}$ (mA) | $V_{max}$ (mV) | $I_{max}$ (mA) | R (%) |
|---|---|---|---|---|
| G | 2384 | 488 | 2158 | 10.50 |
| H | 2512 | 492 | 2283 | 11.17 |
| J | 3085 | 496 | 2846 | 14.06 |

The performance of solar cells of the invention gives rise to an increase in photo-voltaic conversion efficiency R of 6.4% over the prior art. A further improvement of 26% was obtained using those cells when an antireflection layer was added. Similarly the short circuit current $I_{cc}$ of cells of the invention was 5.4% greater than that of prior art cells.

EXAMPLE 6

Two batches, each comprising about 400 solar cells were manufactured industrially, respectively for samples J and K. Preparation of sample J is described above in Example 5. Sample K was prepared in a manner analogous to sample G of Example 5 with the exception that it was coated with an antireflection layer in the same manner as sample J.

The cells made were evaluated by an electrical test. The test consisted in imposing a voltage of 450 mV on each cell and in measuring the current it delivered. Depending on the resulting photo-voltaic conversion efficiency R, the cells were classified into classes referenced a to l, where a is the class corresponding to the highest efficiency (R greater than or equal to 14%), and class l corresponds to cells having the lowest efficiency (R lying in the range 11.50% to 11.25%).

Figure 7:
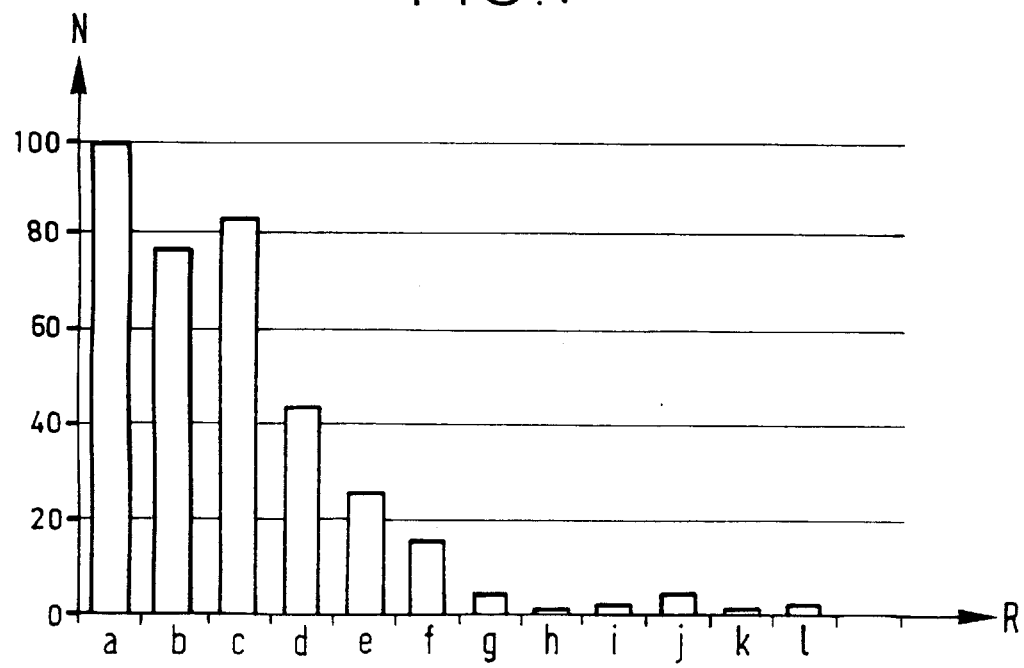
FIG. 7 is a histogram showing the distribution of photovoltaic conversion efficiencies obtained during industrial manufacture of a batch of solar cells of the present invention, the number N of cells being plotted up the ordinate and conversion efficiency R being given in the form of classes along the abscissa (classes referenced a to l)
Figure 8:
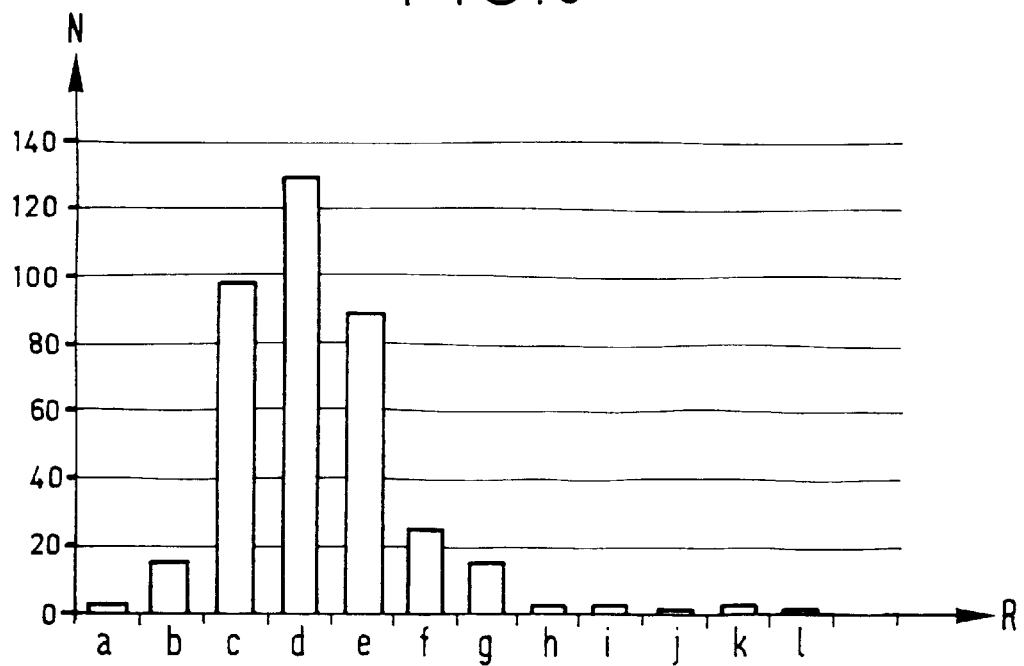
FIG. 8 is analogous to FIG. 7 but for a batch of solar cells manufactured by the prior art method.

The distribution histograms are given in FIGS. 7 and 8 which correspond respectively to the samples J and K.

In the batch manufactured using prior art samples K, centered on class d (R lying in the range 13.50% to 13.25%), the majority of the cells lie in efficiency classes c to e (R lying in the range 13.75% to 13%). It should be observed that very few cells were found in classes a and b corresponding to higher efficiencies (R greater than or equal to 13.75%).

The batch using samples J of the present invention had a majority of cells with efficiencies lying in classes a to c (R greater than or equal to 13.50%) and corresponding to the highest efficiencies.

Naturally, the various worked examples are given by way of example only and the present invention is not limited to the implementations described but is capable of numerous variants available to the person skilled in the art without going beyond the spirit of the invention. In particular, the parametric conditions for various steps of the method, such as duration or temperature, can be adapted without going beyond the ambit of the present invention.

We claim:

1. A method of acidic texturizing a surface of p-type multi-crystalline silicon and alloys thereof, the method consisting essentially in combining the following two steps:

a first step constituted by partial corrosion of said surface by an oxidizing solution also containing fluorine ions, for the purpose of forming a silicon surface porous layer; and a second step which consists in dissolving said porous layer to reveal a texturized surface cratered with cavities of depth and diameter lying in the range of 0.10 $\mu$m to 10 $\mu$m.

2. A method according to claim 1, in which said solution is an acid aqueous solution.

3. A method according to claim 1, in which said solution is an organic solution.

4. A method according to claim 1, in which said solution contains an oxidizing agent selected from the chromate ion, the bromate ion, the nitrate ion, the nitrite ion, the amine ion, a metallic redox couple, and mixtures thereof.

5. A method according to claim 1, in which said solution further contains an inhibitor agent.

6. A method according to claim 1, in which said second step consists in dissolution in a solution selected from an alkaline aqueous solution, an organic solution of ethylene glycol, and an organic solution of hydrazine.

7. A method according to claim 6, in which said dissolution is performed in an alkaline aqueous solution in which the alkali concentration lies in the range 0.001 M to 2 M.

8. A method according to claim 6, in which said alkali is selected from sodium hydroxide, potassium hydroxide, ammonium hydroxide, and mixtures thereof.

9. A method according to claim 1, further including, before said first step, a prior step of limited chemical etching of said surface by an alkaline aqueous solution at a temperature greater than 30° C.

10. A method according to claim 1, further including, after said second step, a third step consisting in depositing an antireflection layer on said surface.

* * * * *